United States Patent

Beurrier

[15] 3,676,790

[45] July 11, 1972

[54] DIFFERENTIAL FEEDBACK AMPLIFIER

[72] Inventor: Henry Richard Beurrier, Chester, N.J.

[73] Assignee: Bell Telephone Laboratories, Incorporated, Murray Hill, N.J.

[22] Filed: June 3, 1971

[21] Appl. No.: 149,666

[52] U.S. Cl. ..............................330/30 D, 330/85, 330/149

[51] Int. Cl. ..............................H03f 3/68

[58] Field of Search ..............................330/30 D, 69, 85, 149, 84

[56] References Cited

UNITED STATES PATENTS 3,525,052 8/1970 Clark ..............................330/149

*Primary Examiner*—Roy Lake
*Assistant Examiner*—James B. Mullins
*Attorney*—R. J. Guenther, et al. and

[57] ABSTRACT

The signal at the output of a signal amplifier is compared, in a differential amplifier, with the input signal to the signal amplifier. Any difference between these two voltages causes an error-correcting voltage to be generated across an impedance in series between the signal source and the signal amplifier input port. This error-correcting voltage is added to the input signal in phase to cancel the output signal error. By using a differential amplifier to produce the error signal, there is no feedback to the signal source, resulting in a high degree of stability.

4 Claims, 2 Drawing Figures

INVENTOR
H.R. BEURRIER
BY
Lyman Sherman
ATTORNEY

DIFFERENTIAL FEEDBACK AMPLIFIER

This application relates to differential feedback amplifiers.

BACKGROUND OF THE INVENTION

It has always been a well-established tenet of circuit theory that the noise figure of an amplifier cannot be improved by means of feedback techniques. As stated by H. W. Bode, in his book "Network Analysis and Feedback Amplifier Design," page 35, "It (feedback) is of little value, however, in dealing with noise due to thermal agitation, shot effects, et cetera, which may be expected to be troublesome in the input stage."

More recently, H. Seidel has shown in his copending application Ser. No. 21,855, filed Mar. 23, 1970, and assigned to applicant's assignee, that this and other seeming limitations derive from the nature of the particular feedback circuits that have been devised heretofore, rather than from any inherent limitations in the technique itself. Specifically, it is shown that by feeding back only the error component present in the amplified output signal, it is possible to realize the advantages of feedback while avoiding many of the limitations previously encountered. More particularly, Seidel utilizes the input signal at least twice. In the first instance, the input signal is applied to the main amplifier wherein it experiences the full gain of the amplifier. Secondly, the input signal is used as a reference against which the amplified output signal is compared. Any difference between the reference signal and the output signal due to any change in gain, noise and/or distortion, is identified as an error signal which is amplified in a separate error amplifier, and then injected into the input end of the main amplifier in such a manner and phase as to degenerate the error.

It is a first advantage of this arrangement that the dynamic range of the error amplifier can be much less than the dynamic range of the main amplifier. As such, the error amplifier can be much smaller than the main amplifier and, hence, will have a much broader bandwidth than the main amplifier. As a result, the overall frequency sensitivity of the feedback loop, is very much less than that of a comparable prior art feedback amplifier and, hence, the stabilized bandwidth is, consequently, much greater.

It is a second advantage of this arrangement that whereas only the error is fed back, only the error is degenerated by the feedback process. Since the error includes noise components generated in the amplifier input circuit, the degeneration of the noise without a corresponding degeneration of the input signal, makes it possible to produce an improvement in the amplifier signal-to-noise ratio. The latter, it should be noted, is modified by the noise in the error amplifier. However, as was noted above, the error amplifier can be a relatively small, and, hence, a very low noise amplifier whose noise contribution is significantly less than the reduction produced in the main amplifier noise by the feedback process.

In order to realize the above-identified advantages, however, an added degree of circuit complexity is required. Basically, a differential feedback amplifier includes a difference network for forming an error signal, and an error amplifier for amplifying the error signal. Finally, the amplified error signal must then be injected into the input port of the main amplifier without reacting with the signal source.

It is the broad object of the present invention to accomplish all of the above-identified circuit functions in a more simplified manner.

A more specific object of the present invention is to so combine and, thereby simplify the circuitry of a differential feedback amplifier so that it can be readily incorporated into an integrated circuit.

SUMMARY OF THE INVENTION

A differential feedback amplifier, in accordance with the present invention, combines the function of error generation, error amplification and error injection in a single differential amplifier. As is known, the total current in a differential amplifier remains substantially constant, being a function primarily of the common emitter impedance (or cathode impedance, in a vacuum tube embodiment). The distribution of this current between the two active elements, however, varies as a function of the instantaneous bias impressed upon the respective elements. In general, when they are excited symmetrically, the current distribution is unaffected. However, when excited asymmetrically, the distribution changes. Accordingly, a portion of the input signal is applied to one of the differential amplifier control electrodes, and serves as the reference signal. A portion of the amplifier output signal is applied to the other control electrode. In the absence of any error component, these two signals are identical, resulting in a symmetrical excitation and no change in the current distribution between the two active elements. However, any error introduced by the signal amplifier produces an error component in the amplifier output, resulting in an asymmetrical excitation of the differential amplifier. The resulting change in the current distribution is reflected as an error-correcting voltage change across an impedance in series with the signal source and the main amplifier input port. Depending upon the phase of the error component, the resulting voltage change either adds to or subtracts from the input signal voltage in a manner to reduce the error.

It is a feature of the invention that the error-correcting voltage is not coupled back to the source, resulting in a highly stable circuit.

These and other objects and advantages, the nature of the present invention, and its various features, will appear more fully upon consideration of the illustrative embodiment now to be described in detail in connection with the accompanying drawings.

DETAILED DESCRIPTION

Figure 1:
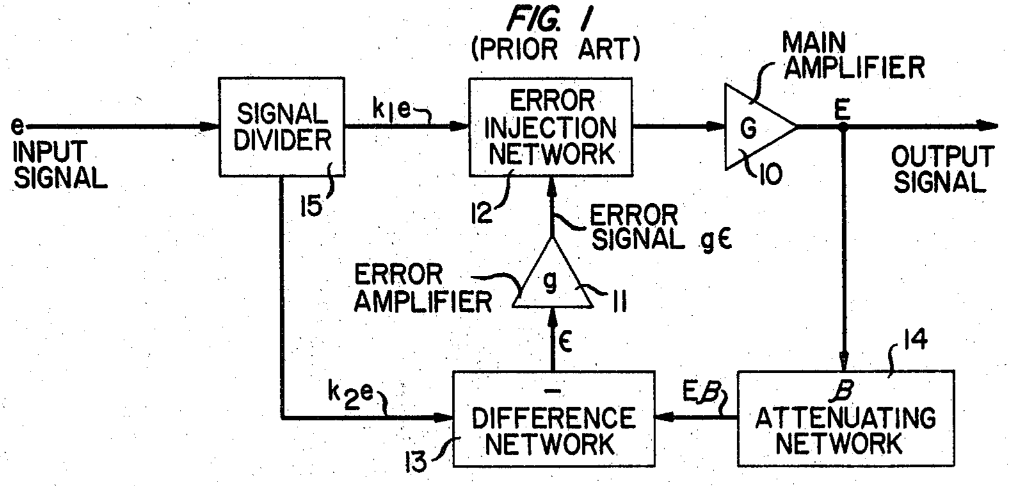
FIG. 1 shows, in block diagram, a prior art differential feedback amplifier.

Referring to the drawings, FIG. 1 shows, in block diagram, a differential feedback amplifier, as described in the prior art, comprising a main amplifier 10 and an error amplifier 11, either or both of which can include one or more cascaded stages. As indicated hereinabove, the input signal is utilized in two, distinctly different ways. In the first instance, it is coupled to the input terminal of the main amplifier and serves, in the conventional manner, as the amplifier input signal. It is, simultaneously, used as a reference signal with which the amplified signal is compared to determine the error introduced by the main amplifier. Accordingly, the input signal $e$ is divided into two components $k_1e$ and $k_2e$ by means of a signal divider 15. One component, $k_1e$, is coupled to the input terminal of amplifier 10 through an error injection network 12. The second component, $k_2e$, is coupled to a difference network 13 along with a second component of signal that is proportional to the main amplifier output signal. The latter signal is coupled to network 13 from the output terminal of amplifier 10 by means of a passive attenuating network 14.

The difference (i.e., error) signal formed by difference network 13 is amplified by means of error signal amplifier 11, and the amplified error signal is simultaneously coupled to the input terminal of amplifier 10, along with the input signal, by means of an error injection network 12.

In operation, signal component $k_1e$, coupled to amplifier 10, is amplified and produces an output signal E, given by $$E = Gk_1e \qquad 1.$$

where G is the gain of amplifier 10.

A fraction, $E\beta$, of the output signal is coupled to difference network 13 along with the reference signal $k_2e$, to form the error signal $\epsilon$. The latter, which is a measure of the distortion introduced into the system by amplifier 10, is amplified by error amplifier 11 and then coupled to the input end of amplifier 10 along with the input signal.

Assuming for the moment that amplifier 10 is a perfect, noise-free amplifier, it then follows that the error signal $\epsilon$, equal to the difference between $E\beta$ and $k_2e$ will be zero. Stated algebraically, $$E\beta - k_2e = 0. \quad 2.$$

Substituting from equation (1), yields $$\beta = (k_2e)/(E) = (k_2)/(k_1) \cdot (1)/(G) \quad 3.$$

where $\beta$ is the attenuation factor of network 14.

Figure 2:
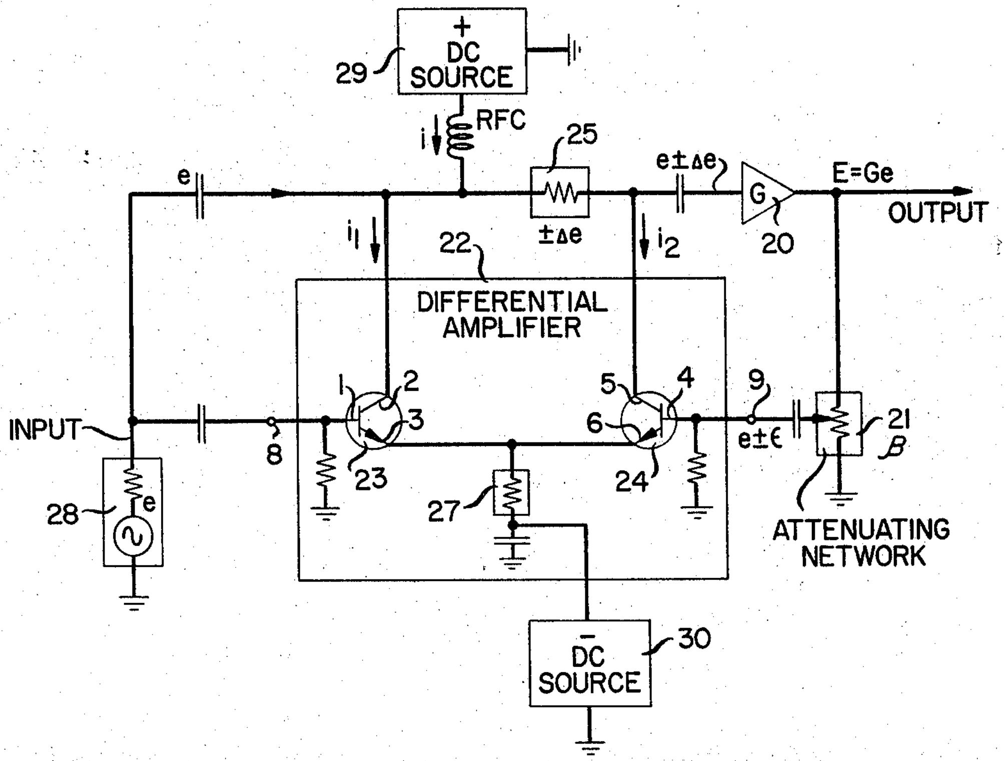
FIG. 2 shows a differential feedback amplifier in accordance with the present invention.

In the specific illustrative embodiment of the invention now to be described in conjunction with FIG. 2, the many circuit functions shown separately in FIG. 1 are all combined in a single differential amplifier circuit. Thus, in FIG. 2, the input signal, derived from a signal source 28, is coupled to the input port of the main amplifier 20 through a series impedance 25. Simultaneously, the input signal is coupled to one input port 8 of a differential amplifier 22.

The amplified output signal from amplifier 20 is coupled to the other input port 9 of differential amplifier 22, through an attenuating network 21.

Differential amplifier 22 can be any of the many known embodiments of this type of amplifier. For purposes of illustration, a transistor embodiment is shown comprising two transistors 23 and 24, each of which has a base electrode (1, 4), an emitter electrode (3, 6) and a collector electrode (2, 5). As illustrated, the input signal is coupled to the base electrode 1 of transistor 23. The attenuated output signal is coupled to the base electrode 4 of transistor 24. The collector electrode 2 of transistor 23 is connected to the junction of the signal source 28 and one end of series impedance 25. In addition, collector 2 is connected to a direct current source 29 through a high, signal impedance, such as a radio frequency choke (RFC).

Collector 5 of transistor 24 is connected to the junction of the amplifier input port and the other end of series impedance 25. The transistor emitters 3 and 6 are connected to ground through a common high impedance 27.

Both transistors are suitably biased by means of a direct current source 30, causing a total current $i$ to flow through the two transistors. The magnitude of this current is primarily determined by the common emitter impedance 27 and the applied bias. The instantaneous distribution, $i_1$ and $i_2$, of the total current between the two transistors is determined by the instantaneous bias applied to the respective transistors. In the case where the biases are equal, the current divides equally between the transistors such that $i_1 = i_2$.

In operation, the input signal is coupled simultaneously to amplifier 20 and differential amplifier 22. The signal coupled to the latter amplifier serves as a reference signal against which the amplified output signal is measured. The signal coupled to amplifier 20, on the other hand, is the signal to be amplified and utilized. Advantageously, the input impedance with amplifier 20 is much greater than the sum of the source impedance and that of series impedance 25 so that the voltage applied to amplifier 20 is essentially the open-circuit source voltage $e$. There is, on the other hand, a direct current voltage drop $i_2Z$ across series impedance 25. However, blocking capacitors prevent this from being communicated to amplifier 20.

When operating properly, the input signal is amplified to produce an output signal $E = Ge$, where G is the amplifier gain. A portion of the output signal is coupled through attenuating network 21 to base electrode 4 of transistor 24. With an attenuating factor $\beta = 1/G$, the portion fed back, $E\beta$, is equal to the reference signal $e$ coupled to base electrode 1 of transistor 23. This causes equal variations in the instantaneous bias applied to the two transistors, and no net change in the current distribution between the transistors. Hence, the current $i_2$ through series impedance 25 remains constant and, therefore, the voltage change $\Delta e$ across impedance 25, under these conditions, is zero.

If, on the other hand, a malfunction tends to change the amplifier gain G, the signal fed back through attenuating network 21 will no longer be equal to the reference signal so that the instantaneous bias applied to the two transistors will no longer be the same. Designating the feedback voltage as $e \pm \epsilon$, where $\epsilon$ is the error component, the signals applied to the differential amplifier can be regarded as comprising a symmetrical component of amplitude $e$ and an asymmetrical component $\epsilon$. The former excites the two transistors equally, causing no redistribution of current and, hence, can be neglected. The latter, by contrast, excites the two unequally, causing a change in the current distribution such that $i_1$ and $i_2$ are no longer equal. This change is reflected as an alternating current component through series impedance 25 which gives rise to a voltage $\Delta e$ in series with the applied input signal. In particular, where $\epsilon$ is positive, indicating an increase in the amplifier gain, the induced voltages $\Delta e$ is out of phase with the applied signal, resulting in a smaller signal $e - \Delta e$ being applied to the input port of amplifier 20, thus tending to reduce the output voltage. If, on the other hand, the output signal is less than it should be, $\epsilon$ is negative, producing an inphase series component $+\Delta e$ which, when added to the input signal, raises the voltage at the amplifier input port to $e + \Delta e$. This, in turn, tends to increase the amplifier output voltage.

More generally, the error component includes all spurious signals, such as noise, introduced by amplifier 20, and distortion components due to nonlinearities in the amplifier. In each instance, the error component results in an asymmetric excitation component being impressed across the differential amplifier which, in turn, causes a compensating component $\Delta e$ to be developed across series impedance 25.

As indicated hereinabove, a principal advantage of a differential feedback amplifier is its ability to improve the noise figure of the main amplifier. However, as was also indicated hereinabove, this improvement will only be realized if the noise contributed by the error amplifier is less than the noise reduction obtained by the feedback process. In the embodiment of FIG. 2, the error amplifier noise includes a noise component introduced by the attenuating network 21. From the noise point of view, this component can be made insignificant by using a reactive voltage divider as the attenuating network. However, for the circuit to be readily integrable, a resistive attenuator is advantageously used. In this latter case, two conditions should be considered. First, to minimize the shunting effect upon the main amplifier output load impedance, the resistance R of the attenuating network is made large compared to the output load impedance. On the other hand, to minimize the noise contributed by the error amplifier, the resistance $R\beta$ introduced into the base circuit by the attenuating network is advantageously made small compared to the impedance of the signal source. As an example, consider the case wherein the source impedance and the output load impedance are each 50 ohms, and wherein the gain factor is 10. To reasonably satisfy both of the noted conditions, a 150 ohm potentiometer can be used as an attenuator, introducing 150 ohms in shunt with the 50 ohm output load impedance, and 15 ohm (150/10) in the base circuit of transistor 24.

It is a characteristic of a differential amplifier that the total current $i$ remains essentially constant. As such, the voltage at the input end of series impedance 25 remains constant at all times. As a result, none of the error-correcting signal is coupled back to the signal source to distort the reference signal. Thus, it is a further advantage of the present invention that the error-correcting signal is directionally coupled to the signal amplifier 20 without the use of directional couplers. More generally, directional amplifier 22 simultaneously serves as the difference, or error forming network; as the error amplifier; and as the error injection network.

Finally, as will be noted, the signal circuit includes only transistors, capacitors and resistors and, hence, is readily integrable.

It will be recognized that the differential amplifier shown in FIG. 2 is merely illustrative of but one of the many different differential amplifiers that can be used to practice the invention. Thus, in all cases it is understood that the above-described arrangement is but one of the many specific embodiments that can represent applications of the principles of the invention. Numerous and varied other arrangements can readily be devised in accordance with these principles by those skilled in the art without departing from the spirit and scope of the invention.

What is claimed is:

1. In combination:
a signal amplifier;
a differential feedback circuit comprising a differential amplifier;
means, including a series impedance, for coupling an input signal to said input port of said signal amplifier;
means for coupling said input signal signal to one of the input ports of said differential amplifier;
means for coupling a portion of the output signal from said signal amplifier to the other input port of said differential amplifier;
and means for coupling the differential output of said differential amplifier across said series impedance to form an error-correcting voltage across said series impedance in response to any difference between said input signal and said portion of amplifier output signal.

2. The combination according to claim 1 wherein equal direct current bias is impressed upon said two active elements.

3. A differential feedback amplifier including, in combination;

a signal source input terminal;
an amplifier;
and differential feedback means comprising:
a series impedance connected between said signal source input terminal and said amplifier input port;
a differential amplifier comprising two active elements, each of which includes a control electrode, and emitting electrode and a collecting electrode;
means for coupling the control electrode of one of said active elements to said input terminal;
means for coupling the collecting electrode of said one active element to the junction of said series impedance and said input terminal;
means for coupling a portion of the amplifier output signal to the control electrode of the other of said active elements;
means for connecting the collecting electrode of said other active element to the junction of said series impedance and said amplifier input port;
means for connecting said emitting electrodes to a common impedance;
direct current biasing means for impressing a bias across each of said active elements; and
a direct current source coupled to the junction of said series impedance and said input terminal.

4. The combination according to claim 3 wherein said active elements are transistors.

* * * * *